(12) United States Patent
Zhan

(10) Patent No.: US 11,437,358 B2
(45) Date of Patent: Sep. 6, 2022

(54) ORGANIC LIGHT EMITTING DIODE DISPLAY DEVICE AND METHOD OF MANUFACTURING THEREOF

(71) Applicant: WUHAN CHINA STAR OPTOELECTRONICS SEMICONDUCTOR DISPLAY TECHNOLOGY CO., LTD., Hubei (CN)

(72) Inventor: Dong Zhan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 231 days.

(21) Appl. No.: 16/772,558

(22) PCT Filed: Jan. 17, 2020

(86) PCT No.: PCT/CN2020/072593
§ 371 (c)(1),
(2) Date: Jun. 12, 2020

(87) PCT Pub. No.: WO2021/042662
PCT Pub. Date: Mar. 11, 2021

(65) Prior Publication Data
US 2022/0115365 A1 Apr. 14, 2022

(30) Foreign Application Priority Data
Sep. 2, 2019 (CN) .......................... 201910821922.1

(51) Int. Cl.
*H01L 29/08* (2006.01)
*H01L 25/18* (2006.01)
(Continued)

(52) U.S. Cl.
CPC .............. *H01L 25/18* (2013.01); *H01L 25/50* (2013.01); *H01L 27/14618* (2013.01);
(Continued)

(58) Field of Classification Search
None
See application file for complete search history.

(56) References Cited

U.S. PATENT DOCUMENTS 10,817,032 B2 10/2020 Yu et al.
2008/0088774 A1 4/2008 Fan Jiang et al.
(Continued)

FOREIGN PATENT DOCUMENTS

CN 107247482 A 10/2017
CN 108663852 A 10/2018
(Continued)

*Primary Examiner* — Hung K Vu
(74) *Attorney, Agent, or Firm* — Osha Bergman Watanabe & Burton LLP

(57) ABSTRACT

An organic light emitting diode (OLED) display device is provided. The OLED display device includes a display panel and a camera. A first alignment mark is formed on a low pixel density area of the display panel, a second alignment mark is formed in the camera, and arrangements of the first alignment mark and the second alignment mark are consistent. Therefore, an alignment accuracy between the camera and the display panel is improved, and a purpose of adopting a blind hole in the area where the camera is mounted on the display device and displaying normally is achieved.

18 Claims, 2 Drawing Sheets

(51) Int. Cl.
*H01L 25/00* (2006.01)
*H01L 27/146* (2006.01)
*H01L 27/32* (2006.01)
*H05K 1/02* (2006.01)
H01L 27/148 (2006.01)
H05K 1/18 (2006.01)

(52) U.S. Cl.
CPC ....... *H01L 27/3272* (2013.01); *H05K 1/0269* (2013.01); *H01L 27/14643* (2013.01); *H01L 27/14806* (2013.01); *H05K 1/18* (2013.01); *H05K 2201/10121* (2013.01); *H05K 2201/10128* (2013.01)

(56) References Cited

U.S. PATENT DOCUMENTS

| | | | |
|---|---|---|---|
| 2013/0201639 A1* | 8/2013 | Ryu | ............ H05K 1/0269 |
| | | | 156/64 |
| 2017/0277219 A1* | 9/2017 | Chung | ............ H01L 27/326 |
| 2019/0373229 A1* | 12/2019 | Zhang | ............ H04M 1/0264 |

FOREIGN PATENT DOCUMENTS

| | | | | | |
|---|---|---|---|---|---|
| CN | 108682391 | A | 10/2018 | | |
| CN | 109003545 | A | 12/2018 | | |
| CN | 109905502 | A | 6/2019 | | |
| CN | 110571254 | A | 12/2019 | | |
| KR | 10-2015-0138903 | | * 12/2015 | ....... | G02F 1/133308 |

* cited by examiner

ORGANIC LIGHT EMITTING DIODE DISPLAY DEVICE AND METHOD OF MANUFACTURING THEREOF

CROSS REFERENCE

The present application claims priority to Chinese Patent Application No. 201910821922.1, filed on Sep. 2, 2019, filed for the invention titled "Organic light emitting diode display device and method of manufacturing thereof," which is hereby incorporated by reference in its entirety.

BACKGROUND OF INVENTION

Field of Invention

The present invention relates to the field of display technology, and more particularly, to an organic light emitting diode display device and a method of manufacturing thereof.

Description of Prior Art

Active-matrix organic light emitting diode (AMOLED) full screens are relatively popular products. Enlarging a screen ratio may improve user experience. In order to achieve a high screen ratio, expanding a display area is achieved by adopting under-screen devices. Accordingly, all modules such as front camera, receiver, and fingerprint recognition of the mobile phone are disposed on a backside of the display screen.

In a currently hole in active area (HIAA) technology, currently AMOLED-based products on the market are mostly rigid products. Generally, a through-hole method is used in the display screens. The display screens are formed through a physical hollowing to release a corresponding area for the camera to take pictures. Because flexible products adopt thin film encapsulation (TFE), and the through-hole method is used for flexible products, so that a reliability of the edge of the hole of the products cannot be guaranteed, and a border of the non-display area needs to be enlarged, which increases difficulty and cost of the manufacturing process. In addition, the border of the non-display area cannot be displayed, so user experience is also poor.

Therefore, the problem of physical hollowing in the currently display devices needs to be solved.

SUMMARY OF INVENTION

An organic light emitting diode (OLED) display device and a method of manufacturing thereof, so the technical problem of physical hollowing in the currently display device is improved.

An organic light emitting diode (OLED) display device comprises:

a display panel, an attachment component, and a camera. The display panel is provided with a low pixel density area. The attachment component is attached to a backside of the display panel, and an area of the attachment component corresponding to the low pixel density area is hollowed out. The camera is disposed on the backside of the display panel and corresponding to the low pixel density area. A first alignment mark is disposed in the low pixel density area of the display panel, and a second alignment mark is disposed inside the camera, and arrangements of the first alignment mark and the second alignment mark are consistent.

In one embodiment, a sub-pixel light emitting unit is disposed in the low pixel density area, and the first alignment mark does not overlap with an orthographic projection of the sub-pixel light emitting unit on the display panel.

In one embodiment, the display panel further comprises a marking layer, and the first alignment mark is disposed on the marking layer.

In one embodiment, the display panel further comprises a metal layer, and the first alignment mark is disposed on the metal layer of the display panel.

In one embodiment, the display panel further comprises a plurality of metal layers, the plurality of metal layers comprise a light-shielding metal layer, a gate metal layer, a source/drain metal layer, and a pixel electrode metal layer, the first alignment mark is disposed on the light-shielding metal layer, and the first alignment mark is disposed on at least one of the light-shielding metal layer, the gate metal layer, the source/drain metal layer, and the pixel electrode metal layer.

In one embodiment, the first alignment mark is formed on the light-shielding metal layer.

In one embodiment, the first alignment mark is formed on the gate metal layer.

In one embodiment, the first alignment mark is formed on the source/drain metal layer.

In one embodiment, the first alignment mark is formed on the pixel electrode metal layer.

In one embodiment, the first alignment mark is arranged in a circle.

In one embodiment, the camera comprises a lens group and a photosensitive unit, and the second alignment mark is formed on a periphery of the photosensitive unit.

In one embodiment, the camera further comprises a circuit board, the photosensitive unit is disposed on the circuit board, and the second alignment mark is formed on an area of the circuit board without the photosensitive unit.

In one embodiment, a first light leakage area is disposed on an area corresponding to the second alignment mark of the circuit board.

In one embodiment, the camera further comprises a circuit board and a transparent substrate, the transparent substrate is disposed on the circuit board, the photosensitive unit is disposed on the transparent substrate, and the second alignment mark is formed on an area of the transparent substrate without the photosensitive unit.

In one embodiment, a second light leakage area is disposed on an area of the circuit board overlapping with the second alignment mark.

In one embodiment, the transparent substrate is made of one of glass and plastic.

In one embodiment, the second alignment mark is arranged in a circle.

In one embodiment, the attachment component is a composite tape.

A method of manufacturing an organic light emitting diode (OLED) display device, comprising steps of: forming a first alignment mark; forming a second alignment mark; and aligning and attaching a camera to a display panel.

In one embodiment, arrangements of the first alignment mark and the second alignment mark are consistent.

The present invention has beneficial effects described as follows. An organic light emitting diode (OLED) display device is provided. A first alignment mark is formed on a low pixel density area, a second alignment mark is formed in the camera, and arrangements of the first alignment mark and the second alignment mark are consistent. Therefore, an alignment accuracy between the camera and the display panel is improved, and a purpose of adopting a blind hole in the area where the camera is mounted on the display device and displaying normally is achieved.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

In view of the technical problem of physical hollowing in the conventional display device, embodiments of the present invention may solve the problem.

Figure 1:
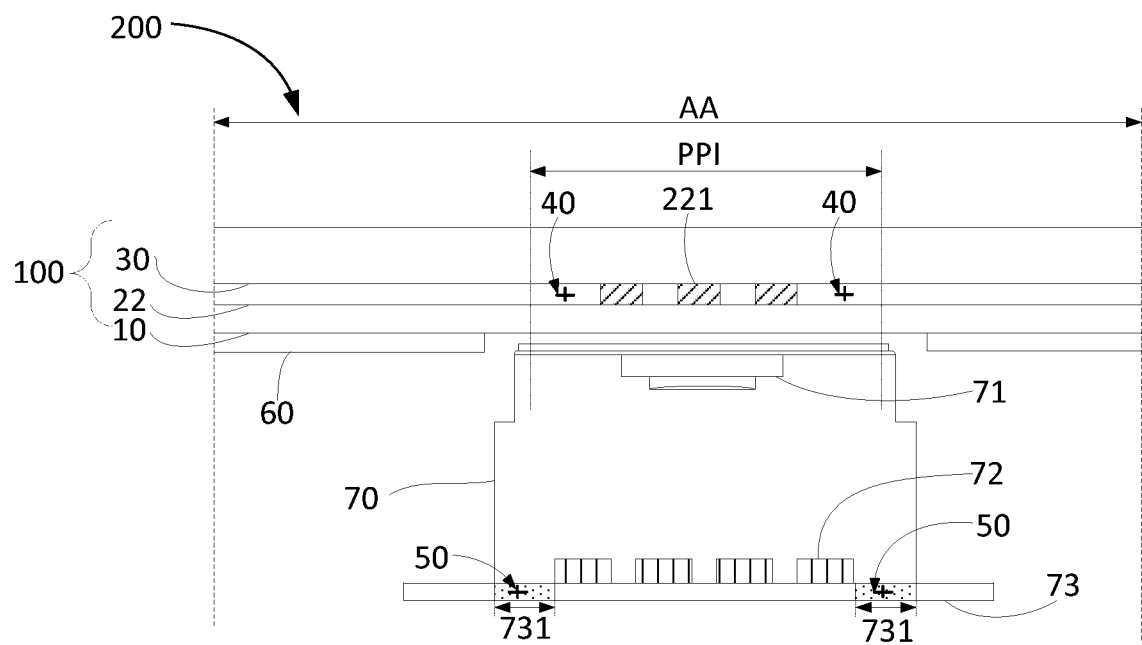
FIG. 1 is a first schematic structural view of an organic light emitting diode OLED display device according to one embodiment of the present invention.

Referring to FIG. 1, in one embodiment, an organic light emitting diode (OLED) display device 200 includes:

a display panel 100, and the display panel 100 is provided with a low pixel density area (PPI);

an attachment component 60 attached to a backside of the display panel 100, and an area of the attachment component corresponding to the low pixel density area is hollowed out; and a camera 70 disposed on the backside of the display panel 100 and corresponding to the low pixel density area (PPI). A first alignment mark 40 is disposed in the low pixel density area (PPI) of the display panel 100, and a second alignment mark 50 is disposed inside the camera, and arrangements of the first alignment mark 40 and the second alignment mark 50 are consistent.

In one embodiment, the low pixel density area (PPI) may be disposed at any position within the display area AA of the display panel 100.

In one embodiment, the attachment component 60 is a composite tape. The composite tape 60 is attached on the backside of the display panel, plays a role of reinforcing the structure of the flexible display panel, and also plays a heat dissipation role.

In the OLED display device according to the embodiment, it is only necessary to perform physical hollowing on the attachment component corresponding to the low pixel density area, and forming a first alignment mark on the display panel and a second alignment mark in the camera may improve the alignment accuracy between the camera and the display panel, thereby achieving the purpose of using a blind hole design and display normally in the area where the camera is installed on the display device. Therefore, it avoids poor reliability of the edge of the hole due to the physical hollowing of the display panel. In addition, it does not need to increase the frame of the non-display area, and it also solves the problem of how the hollow area cannot display.

In one embodiment, referring to FIG. 1, a sub-pixel light emitting unit 221 is disposed in the low pixel density area (PPI) of the display panel 100, and the first alignment mark 40 does not overlap with an orthographic projection of the sub-pixel light emitting unit 221 on the display panel.

Specifically, the display panel 100 further includes an active layer 10, a light emitting layer 22, and a packaging layer 30. The sub-pixel light emitting unit 221 is disposed in the light emitting layer 22. An arrangement density of the sub-pixel light emitting unit 221 corresponding to the low pixel density area (PPI) is less than an arrangement density of the sub-pixel light emitting unit in other areas of the display area AA of the display panel 100.

In one embodiment, the display panel 100 further includes a marking layer, and the first alignment mark 40 is disposed on the marking layer. The marking layer and the light emitting layer 22 are disposed on the same layer, that is, the first alignment mark 40 is disposed on the light emitting layer 22.

Specifically, the first alignment mark 40 is formed on an area of the light emitting layer 22 without the sub-pixel light emitting unit 221.

Figure 2:
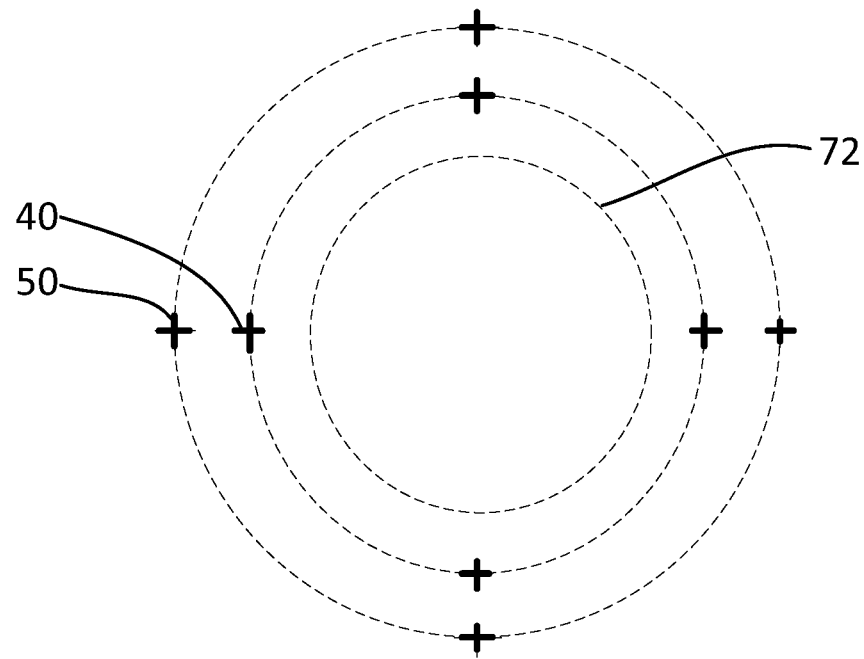
FIG. 2 is a schematic view of the positional relationship between the first registration mark and the second registration mark in a horizontal projection direction.

In one embodiment, referring to FIG. 2, the first alignment mark is arranged in a circle.

In one embodiment, referring to FIG. 1, the camera includes a lens group 71 and a photosensitive unit 72, and the second alignment mark is disposed on a periphery of the photosensitive unit 72.

Specifically, referring to FIG. 1, the camera 70 further includes a circuit board 73, and the second alignment mark is formed on an area of the circuit board 73 without the photosensitive unit 72.

Furthermore, the second alignment mark 50 adopting a single-layer copper structure is disposed on an area of the circuit board 73, that is the second alignment mark 50 is formed by using the single-layer copper structure and a first light leakage area 731 at the area at the same time.

In one embodiment, referring to FIG. 2, the second alignment mark 50 is also arranged in a circle, and arrangements of the second alignment mark 50 and the first alignment mark 40 are consistent. Referring to FIG. 2, it is a schematic view of the positional relationship between the first registration mark 40 and the second registration mark 50 in a horizontal projection direction, and the center area is provided with the photosensitive unit 72.

Specifically, the positional relationship between the first alignment mark and the second alignment mark may be calculated based on the principle of the optical path.

In one embodiment, the photosensitive unit 72 may be a complementary metal oxide semiconductor (CMOS) or a charge coupled device (CCD). Both the CMOS and the CCD are made of high photosensitive semiconductor materials, and they may convert light signals into electrical signals, and then convert them into digital signals through analog-to-digital converter chips. Both CMOS and CCD may be used as photosensitive elements of the camera.

In one embodiment, aligning and attaching a camera 70 to display panel 100 are carried out by identifying the first alignment mark 40 on the display panel 100 and the second alignment mark 50 in the camera 70 through using a CCD of an attachment device.

Specifically, the CCD of the attachment device identifies the second alignment mark 50 through the first light leakage area 731 or the lens group 71, and identifies the first alignment mark 40 through the front of the display panel 100 or the first light leakage area 731.

In one embodiment, when the camera 70 aligned and attached to the display panel 100 is finished, the first light leakage area 731 is shielded with a light shielding material such as light shielding tape or light shielding glue (not shown), so as to prevent external light from interfering with the internal light path of the camera.

In one embodiment, due to forming the first alignment mark and the second alignment mark, the alignment accuracy between the display panel and the camera is improved. When the OLED display device is manufactured with a blind hole and a low pixel density area, the photosensitive unit may effectively avoid the influence of the sub-pixel light emitting unit of the. Therefore, the utilization efficiency of the external light by the photosensitive unit is improved.

In one embodiment, the marking layer forming the first alignment mark may be a light emitting layer or any layer of the display panel. For specific implementation, please refer to the description of the foregoing embodiments, and details are not described herein again.

Figure 3:
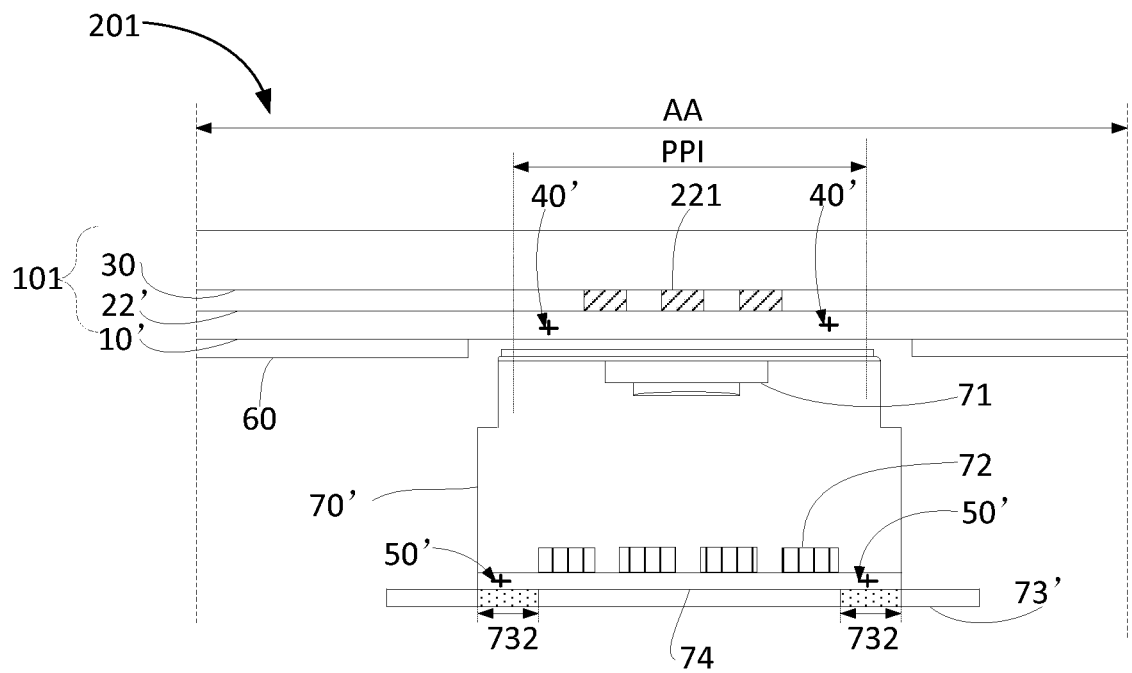
FIG. 3 is a second schematic structural view of an OLED display device according to one embodiment of the present invention.

In one embodiment, referring to FIG. 3, the OLED display device 201 includes a display panel 101, an attaching component 60, and a camera 70'. The display panel 101 is provided with a low pixel density area PPI, corresponding to the low pixels. The display panel 101 is provided with a low pixel density area (PPI).

A first alignment mark 40' is disposed in the low pixel density area of the display panel, and a second alignment mark 50' is disposed inside the camera. A sub-pixel light emitting unit 221 is disposed in the light emitting layer 22' corresponding to the low pixel density area (PPI).

In one embodiment, the attachment component 60 is attached to a backside of the display panel 101, and an area of the attachment component 60 corresponding to the low pixel density area (PPI) is hollowed out.

In one embodiment, referring to FIG. 3, the display panel 101 includes an active layer 10', a light emitting layer 22', and a packaging layer 30. The active layer 10' and the light emitting layer 22' include a metal layer, and the first alignment mark 40' is formed on the metal layer.

Figure 4:
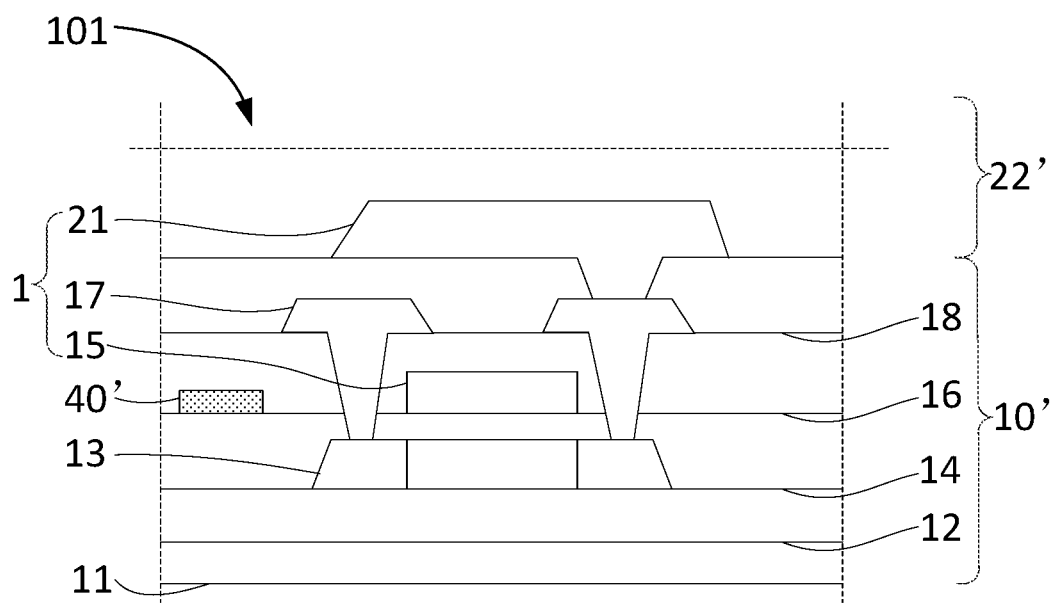
FIG. 4 is a side view of a part of layer structure of the display panel of the OLED display device according to one embodiment of the present invention.

Specifically, referring to FIG. 4, it is a side view of a part of layer structure of the display panel 101 of the OLED display device 201 according to one embodiment of the present invention. The active layer 10' includes a substrate 11, a buffer layer 12, a source/drain layer 13, a gate insulating layer 14, a gate metal layer 15, an interlayer insulating layer 16, a source/drain metal layer 17, and a planarization layer 18. The light emitting layer 22' includes a pixel electrode metal layer 21. The gate metal layer 15, the source/drain metal layer 17, and the pixel electrode metal layer 21 are referred to as a metal layer 1.

Furthermore, the first alignment mark 40' is formed on the metal layer 1.

Specifically, the first alignment mark 40' is formed on at least one of the gate metal layer 15, the source/drain metal layer 17, and the pixel electrode metal layer 21.

Furthermore, the first alignment mark 40' is formed on the gate metal layer 15 as shown in FIG. 4.

Specifically, the gate metal layer 15 is patterned to form the gate and the first alignment mark 40' at the same time.

Furthermore, and the first alignment mark 40' does not overlap with an orthographic projection of the sub-pixel light emitting unit 221 on the display panel, and the orthographic projection of the first alignment mark 40' is located at a periphery of the projection of the sub-pixel light emitting unit 221.

Furthermore, the first alignment mark 40' is arranged in a circular.

In one embodiment, when the active layer is made of an indium gallium zinc oxide (IGZO), the metal layer further includes a light-shielding metal layer (not shown), and the first alignment mark 40' may also be formed on the light-shielding metal layer.

Specifically, metal oxide semiconductor (IGZO) is relatively sensitive to light. After being irradiated with light, the threshold voltage of the metal oxide semiconductor TFT is significantly negatively shifted, so a light-shielding metal layer needs to be disposed under the active layer to block light.

In one embodiment, referring to FIG. 3, the camera 70' includes a lens group 71, a photosensitive unit 72, a transparent substrate 74, and a circuit board 73'. The transparent substrate 74 is disposed on the circuit board 73'. The photosensitive unit 72 is disposed on the transparent substrate 74. A size of the transparent substrate 74 is larger than a size of the photosensitive unit 72. The second alignment mark 50' is formed on an area of the transparent substrate 74 without the photosensitive unit 72.

Furthermore, the second alignment mark 50' is formed on a periphery of the photosensitive unit 72.

Furthermore, the second alignment mark 50' is arranged in a circle and surrounds the photosensitive unit 72, and arrangements of the second alignment mark 50' and the first alignment mark 40' are consistent. The specific arrangement position relationship is similar to that in FIG. 2, and is not described again.

In one embodiment, an area where the circuit board 73' overlaps with the second alignment mark 50' is subjected to a light transmission process to form a second light leakage area 732.

Specifically, the light transmission process may be carried out through hollowing out overlapping area on the circuit board.

In one embodiment, the transparent substrate is made of one of glass and plastic.

The first alignment mark 40' on the display panel 101 and the second alignment mark 50' in the camera 70' are identified through using a CCD of an attachment device, so as to carried out attachment.

Specifically, the CCD of the attachment device identifies the second alignment mark 50' through the second light leakage area 732 or the lens group 71, and identify the first alignment mark 40' through the front of the display panel 100 or the second light leakage area 732.

In one embodiment, when the camera 70' aligned and attached to the display panel 100 is finished, the second light leakage area 732 is shielded with a light shielding material such as light shielding tape or light shielding glue (not shown), so as to prevent external light from interfering with the internal light path of the camera.

In one embodiment, the first alignment mark 40' may be further formed on at least one of the light-shielding metal layer, the source/drain metal layer, or the pixel electrode metal layer. For specific implementation, please refer to the foregoing embodiments, and details are not described herein again.

In one embodiment, when the camera is attached to the middle frame of the OLED display device, forming the alignment mark to improve the alignment accuracy between the camera and the display panel is still workable.

A method of manufacturing an organic light emitting diode (OLED) display device includes steps of:

step S1: forming a first alignment mark, and this step includes providing a display panel, forming the first alignment mark on a metal layer corresponding to the low pixel density area of the display panel, and the first alignment mark is arranged in a circle;

step S2: forming a camera, and this step includes forming a transparent substrate on a circuit board and forming a photosensitive unit on the transparent substrate, and a size of the transparent substrate is larger than a size of the photosensitive unit;

step S3: forming a second alignment mark; and this step includes forming a second alignment mark on an area of the transparent substrate without the photosensitive unit, and arrangements of the first alignment mark and the second alignment mark are consistent.

step S4: forming a light leakage area, and this step includes using a method such as hollowing, to carry out light transmission processing on an area where the circuit board overlaps with the second alignment mark to form a second light leakage area;

step S5: assembling a camera, and this step includes assembling a lens group and a lower component of the camera with the second alignment mark;

step S6: aligning and attaching a camera to a display panel, and this step includes identifying the first alignment mark 40' on the display panel 101 and the second alignment mark 50' in the camera 70' through using a CCD of an attachment device, so as to carried out attachment.

step S7: performing a shielding process, and this step includes that when the camera aligned and attached to the display panel is finished, the second light leakage area at the bottom of the camera is shielded through the shielding process.

Specifically, in the step S1, the metal layer includes a light-shielding metal layer, a gate metal layer, a source/drain metal layer, and a pixel electrode metal layer, and the first alignment mark is formed by at least one of the metal layers.

Specifically, in the step S1, the light emitting layer corresponding to the low pixel density area is provided with sub-pixel light-emitting units, and a distribution density of the sub-pixel light-emitting units is less than the distribution density of the sub-pixel light-emitting units in other display regions of the display panel.

Specifically, in the step S1, an attachment component is formed on a backside of the display panel, and an area of the attachment component corresponding to the low pixel density area is hollowed out.

Specifically, the attachment component may be hollowed out in a region corresponding to the low pixel density by a physical hollowing method.

Furthermore, the attachment component is a composite tape.

Specifically, in the step S2, the transparent substrate is made of one of glass and plastic.

Specifically, in the step S2, the photosensitive unit may be a CMOS or a CCD.

Specifically, in the step S3, if the camera is not provided with a transparent substrate, the second alignment mark may be formed on the circuit board.

Furthermore, the second alignment mark is formed on an area of the circuit board without the photosensitive unit, and the area adopts a single-layer copper structure.

Specifically, in step S3, the positional relationship between the first alignment mark and the second alignment mark may be calculated based on the principle of the optical path.

Specifically, in step S6, the CCD of the attachment device identifies the second alignment mark from the second light leakage area or the lens group, and identifies the first alignment mark from the front of the display panel or the second light leakage.

Specifically, in the step S7, the second light leakage area is shielded with a light shielding material such as light shielding tape or light shielding glue, so as to prevent external light from interfering with the internal light path of the camera.

According to the above embodiments, it can be known that:

An organic light emitting diode (OLED) display device and a method of manufacturing thereof are provided. The OLED display device includes a display panel, an attachment component, and a camera. A first alignment mark is formed on the display panel corresponding to the low pixel density area. A second alignment mark is formed on the circuit board of the camera or on the transparent substrate. A CCD of the attachment device is used to identify the first alignment mark and the second alignment mark, thereby aligning and attaching a camera to a display panel. Therefore, the alignment accuracy between the camera and the display panel is improved, and the photosensitive unit affected by sub-pixel light emitting unit in the low pixel density area on the display panel can be effectively avoided, and realizing the purpose of adopting a blind hole in the area where the camera is mounted on the display device and displaying normally.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An organic light emitting diode (OLED) display device, comprising:
   a display panel, wherein the display panel is provided with a low pixel density area;
   an attachment component attached to a backside of the display panel, wherein an area of the attachment component corresponding to the low pixel density area is hollowed out; and
   a camera disposed on the backside of the display panel and corresponding to the low pixel density area;
   wherein a first alignment mark is disposed in the low pixel density area of the display panel, and a second alignment mark is disposed inside the camera, and arrangements of the first alignment mark and the second alignment mark are consistent.

2. The OLED display device according to claim 1, wherein a sub-pixel light emitting unit is disposed in the low pixel density area, and the first alignment mark does not overlap with an orthographic projection of the sub-pixel light emitting unit on the display panel.

3. The OLED display device according to claim 2, wherein the display panel further comprises a marking layer, and the first alignment mark is disposed on the marking layer.

4. The OLED display device according to claim 2, wherein the display panel further comprises a metal layer, and the first alignment mark is disposed on the metal layer of the display panel.

5. The OLED display device according to claim 2, wherein the display panel further comprises a plurality of metal layers, the plurality of metal layers comprise a light-shielding metal layer, a gate metal layer, a source/drain metal layer, and a pixel electrode metal layer, the first alignment mark is disposed on the light-shielding metal layer, and the first alignment mark is disposed on at least one of the light-shielding metal layer, the gate metal layer, the source/drain metal layer, and the pixel electrode metal layer.

6. The OLED display device according to claim 5, wherein the first alignment mark is formed on the light-shielding metal layer.

7. The OLED display device according to claim 5, wherein the first alignment mark is formed on the gate metal layer.

8. The OLED display device according to claim 5, wherein the first alignment mark is formed on the source/drain metal layer.

9. The OLED display device according to claim 5, wherein the first alignment mark is formed on the pixel electrode metal layer.

10. The OLED display device according to claim 1, wherein the first alignment mark is arranged in a circle.

11. The OLED display device according to claim 1, wherein the camera comprises a lens group and a photosensitive unit, and the second alignment mark is formed on a periphery of the photosensitive unit.

12. The OLED display device according to claim 11, wherein the camera further comprises a circuit board, the photosensitive unit is disposed on the circuit board, and the second alignment mark is formed on an area of the circuit board without the photosensitive unit.

13. The OLED display device according to claim 12, wherein a first light leakage area is disposed on an area corresponding to the second alignment mark of the circuit board.

14. The OLED display device according to claim 13, wherein a second light leakage area is disposed on an area of the circuit board overlapping with the second alignment mark.

15. The OLED display device according to claim 14, wherein the transparent substrate is made of one of glass and plastic.

16. The OLED display device according to claim 11, wherein the camera further comprises a circuit board and a transparent substrate, the transparent substrate is disposed on the circuit board, the photosensitive unit is disposed on the transparent substrate, and the second alignment mark is formed on an area of the transparent substrate without the photosensitive unit.

17. The OLED display device according to claim 1, wherein the second alignment mark is arranged in a circle.

18. The OLED display device according to claim 1, wherein the attachment component is a composite tape.

\* \* \* \* \*